(12) United States Patent
Wong et al.

(10) Patent No.: US 11,463,079 B2
(45) Date of Patent: Oct. 4, 2022

(54) POWER TRANSISTOR DRIVING METHOD, DRIVING CIRCUIT AND SWITCHING CIRCUIT

(71) Applicant: Joulwatt Technology (Hangzhou)Co., LTD., Zhejiang (CN)

(72) Inventors: Pitleong Wong, Zhejiang (CN); Liyu Lin, Zhejiang (CN); Xunwei Zhou, Zhejiang (CN)

(73) Assignee: Joulwatt Technology (Hangzhou) Co., LTD., Zhejiang (CN)

( * ) Notice: Subject to any disclaimer, the term of this patent is extended or adjusted under 35 U.S.C. 154(b) by 66 days.

(21) Appl. No.: 17/092,355

(22) Filed: Nov. 9, 2020

(65) Prior Publication Data
US 2021/0152169 A1    May 20, 2021

(30) Foreign Application Priority Data
Nov. 15, 2019 (CN) .......................... 201911119720.9

(51) Int. Cl.
*H03K 17/0412* (2006.01)
*H02M 1/088* (2006.01)
*H03K 17/687* (2006.01)

(52) U.S. Cl.
CPC ...... *H03K 17/04123* (2013.01); *H02M 1/088* (2013.01); *H03K 17/6871* (2013.01)

(58) Field of Classification Search
CPC ......... H03K 17/04123; H03K 17/6871; H03K 17/0822; H03K 17/166; H02M 1/088; H02M 1/08
See application file for complete search history.

(56) References Cited

U.S. PATENT DOCUMENTS 9,236,866 B2 *   1/2016  Youn ...................... H02M 3/158
2019/0238129 A1 * 8/2019  Fukushima ............. H02M 1/08

* cited by examiner

*Primary Examiner* — Metasebia T Retebo
(74) *Attorney, Agent, or Firm* — Yu Gang

(57) ABSTRACT

The present disclosure provides a power transistor driving method. When a power transistor is turned off, a drain-source voltage of the power transistor is detected, and when the power transistor is an N-type component, and a change rate of the drain-source voltage of the power transistor along with time is lower than a first slope threshold, the power transistor is pulled down in a first current; when the change rate of the drain-source voltage of the power transistor along with the time is higher than the first slope threshold, a driving pole of the power transistor is pulled down in a second current; and when the change rate of the drain-source voltage of the power transistor along with the time is lower than the first slope threshold again, a pull-down switch is turned on or the driving pole of the power transistor is pulled down in a third current.

19 Claims, 5 Drawing Sheets

First pull-down circuit

POWER TRANSISTOR DRIVING METHOD, DRIVING CIRCUIT AND SWITCHING CIRCUIT

CROSS-REFERENCE TO RELATED APPLICATIONS

The present disclosure is filed based on and claims priority to Chinese patent application No. 201911119720.9, filed on Nov. 15, 2019, the present disclosure of which is hereby incorporated by reference in its entirety.

TECHNICAL FIELD

The present disclosure relates to the field of power electronic technologies, and in particular to a power transistor driving method, a driving circuit and a switching circuit.

BACKGROUND

The control of a turn-off process of a power component in a switching power supply directly affects the reliability of the switching power supply. When the turn-off process of the power component is not handled properly, not only low system efficiency is caused, but also the power component is damaged, and the reliability of a system is affected. Therefore, how to reliably turn off a switching component is an important problem in power component driving.

SUMMARY

At least some embodiments of the present disclosure provide a power transistor driving method, a driving circuit and a switching circuit, so as at least to partially solve a problem in the related art that a turn-off process of a power component is not high in reliability.

In an embodiment of the present disclosure, a power transistor driving method is provided, when a power transistor is turned off, a drain-source voltage of the power transistor is detected, and when the power transistor is an N-type component, and a change rate of the drain-source voltage of the power transistor along with time is less than a first slope threshold, the power transistor is pulled down in a first current; when the change rate of the drain-source voltage of the power transistor along with the time is higher than the first slope threshold, a driving pole of the power transistor is pulled down in a second current; and when the change rate of the drain-source voltage of the power transistor along with the time is less than the first slope threshold again, a pull-down switch of a power transistor driving circuit is turned on or the driving pole of the power transistor is pulled down in a third current;

when the power transistor is a P-type component, and a change rate of an absolute value of the drain-source voltage of the power transistor along with the time is less than the first slope threshold, the driving pole of the power transistor is pulled up in the first current; when the change rate of the absolute value of the drain-source voltage of the power transistor along with the time is higher than the first slope threshold, the driving pole of the power transistor is pulled up in the second current; and when the change rate of the absolute value of the drain-source voltage of the power transistor along with the time is less than the first slope threshold again, a pull-up switch of the power transistor driving circuit is turned on or the driving pole of the power transistor is pulled up in the third current; and the third current is higher than the second current.

In an optional embodiment of the present disclosure, the first current is equal to the second current.

In an optional embodiment of the present disclosure, the first current is a fixed current value.

In another embodiment of the present disclosure, a power transistor driving circuit is further provided, when a power transistor is turned off, a drain-source voltage of the power transistor is detected by the power transistor driving circuit, and when the power transistor is an N-type component, and a change rate of the drain-source voltage of the power transistor along with time is less than a first slope threshold, the power transistor is pulled down in a first current by the power transistor driving circuit; when the change rate of the drain-source voltage of the power transistor along with the time is higher than the first slope threshold, a driving pole of the power transistor is pulled down in a second current by the power transistor driving, circuit; and when the change rate of the drain-source voltage of the power transistor along with the time is less than the first slope threshold again, a pull-down switch of the power transistor driving circuit is turned on or the driving pole of the power transistor is pulled down in a third current by the power transistor driving circuit;

when the power transistor is a P-type component, and a change rate of an absolute value of the drain-source voltage of the power transistor along with the time is less than the first slope threshold, the driving pole of the power transistor is pulled up in the first current by the power transistor driving circuit; when the change rate of the absolute value of the drain-source voltage of the power transistor along with the time is higher than the first slope threshold, the driving pole of the power transistor is pulled up in the second current by the power transistor driving circuit; and when the change rate of the absolute value of the drain-source voltage of the power transistor along with the time is less than the first slope threshold again, a pull-up switch of the power transistor driving circuit is turned on or the driving pole of the power transistor is pulled up in the third current by the power transistor driving circuit; and the third current is higher than the second current.

In an optional embodiment of the present disclosure, the first current is equal to the second current.

In an optional embodiment of the present disclosure, the first current is a fixed current value.

In an optional embodiment, the power transistor driving circuit further includes a slope detection circuit, configured to detect the change rate of the drain-source voltage of the power transistor along with the time.

In an optional embodiment, the power transistor driving circuit further includes a first pull-down circuit and a second pull-down circuit, herein the first pull-down circuit is configured to pull down the driving pole of the power transistor in the second current; the second pull-down circuit comprises the pull-down switch; and during a turn-off period of the power transistor, when the change rate of the drain-source voltage of the power transistor along with the time is firstly higher than the first slope threshold, and then less than the first slope threshold, the pull-down switch of the second pull-down circuit is turned on.

In an optional embodiment, the second pull-down circuit includes a first transistor, a second transistor, a third transistor, a second current source, a first switch and a first resistance, the second current source and the first switch are serially connected to form a first series circuit, a drain electrode of the first transistor is connected with the driving pole of the power transistor, a drain electrode of the second transistor is connected with a driving pole of the first transistor, the first series circuit is connected with the driving pole of the first transistor, a driving pole of the second transistor is connected with a reference ground through the first resistance, a source electrode of the first transistor and a source electrode of the second transistor are connected with the reference ground, the driving pole of the second transistor receives an output voltage of the slope detection circuit, the third transistor is connected between the driving pole of the first transistor and the reference ground, when the power transistor is turned off, and the change rate of the drain-source voltage of the power transistor along with the time is less than the first slope threshold, the first switch is turned off, the third transistor is turned on, the second pull-down switch is not enabled, and the driving pole of the power transistor is not pulled down by the first transistor; when the change rate of the drain-source voltage of the power transistor along with the time is higher than the first slope threshold, the first switch is turned on, the third transistor is turned off, and the second pull-down circuit is enabled; when the change rate of the drain-source voltage of the power transistor along with the time is less than the first slope threshold again, the second pull-down circuit is continuously enabled; and the first transistor is the pull-down switch.

In an optional embodiment, the second pull-down circuit further comprises a first turn-on element, the first turn-on element is connected between a driving pole and a drain electrode of the second transistor, the first turn-on element is a transistor and a drain electrode of the transistor is connected with a driving pole of the transistor, or the first turn-on element is a diode.

In an optional embodiment, the second pull-down circuit further includes a first logic circuit, the first logic circuit is configured to receive an output voltage of the slope detection circuit, and control turn-on and turn-off of the first switch and the third transistor.

In an optional embodiment, including a third pull-down circuit and a first pull-up circuit, herein the third pull-down circuit is configured to pull down the driving pole of the power transistor in the first current;

the first pull-up circuit is configured to receive the output voltage of the slope detection circuit, when the change rate of the drain-source voltage of the power transistor along with the time is less than the first slope threshold, the driving pole of the power transistor is not pulled up; and when the change rate of the drain-source voltage of the power transistor along with the time is higher than the first slope threshold, the driving pole of the power transistor is pulled up.

In an optional embodiment, the first pull-up circuit includes a fourth transistor and a fifth transistor, a source electrode of the fourth transistor and a source electrode of the fifth transistor are connected with the driving pole of the power transistor, a drain electrode of the fourth transistor is connected with a driving pole of the fourth transistor, and configured to receive the output voltage of the slope detection circuit.

In an optional embodiment, the first pull-up circuit further includes a second turn-on element and a first current limiting circuit, the first current limiting circuit is connected with a drain electrode of the fifth transistor, the second turn-on element is connected between the source electrode of the fourth transistor and the drain electrode of the fifth transistor, the second turn-on element is a transistor and a drain electrode of the transistor is connected with a driving pole of the transistor, or the second turn-on element is a diode.

In an optional embodiment, the slope detection circuit is a first capacitance, the third pull-down circuit is a fourth current source, the first current is equal to the third current, and a value of the fourth current source is equal to the third current.

In an optional embodiment, the power transistor driving circuit includes a sixth transistor, the driving pole of the power transistor is connected with the reference ground through the sixth transistor, when a driving pole voltage of the power transistor is less than a first voltage threshold, the sixth transistor is turned on.

In an optional embodiment, the slope detection circuit is a first capacitance, the first pull-down circuit is a first current source or a second resistance or a seventh transistor, a value of the first current source is equal to the second current.

In an optional embodiment, the first capacitance adopts a first power transistor is a first power transistor of which has a type is the same as a type of the power transistor, a source electrode of the first power transistor is connected with the second pull-down circuit, and drain electrode of the first power transistor is connected with a drain electrode of the power transistor.

In an optional embodiment, when the driving pole voltage of the power transistor is less than the first voltage threshold, the first transistor is turned on.

In an optional embodiment of the present disclosure, a switching circuit is further provided.

Circuit structure and method of the present disclosure are adopted. Compared with the related art, it has the following advantages: rapid turn-off process, high reliability and good electromagnetic compatibility.

DETAILED DESCRIPTION

Exemplary embodiments of the present disclosure are described in detail below in combination with drawings, but the present disclosure is not limited to these embodiments. The present disclosure covers any replacements, modifications, equivalent methods and schemes made within the spirit and scope of the present disclosure.

In order to make the public understand the present disclosure completely, specific details are described in detail in the following exemplary embodiments of the present disclosure, and the present disclosure may also be fully understood by those skilled in the art without the descriptions of these details.

In the following paragraphs, the present disclosure is described in more detail by way of example with reference to the drawings. It is to be noted that the drawings all adopt a relatively simplified form and all use an imprecise proportion, and are used for a purpose of conveniently and clearly assisting to describe the embodiments of the present disclosure.

Figure 1:
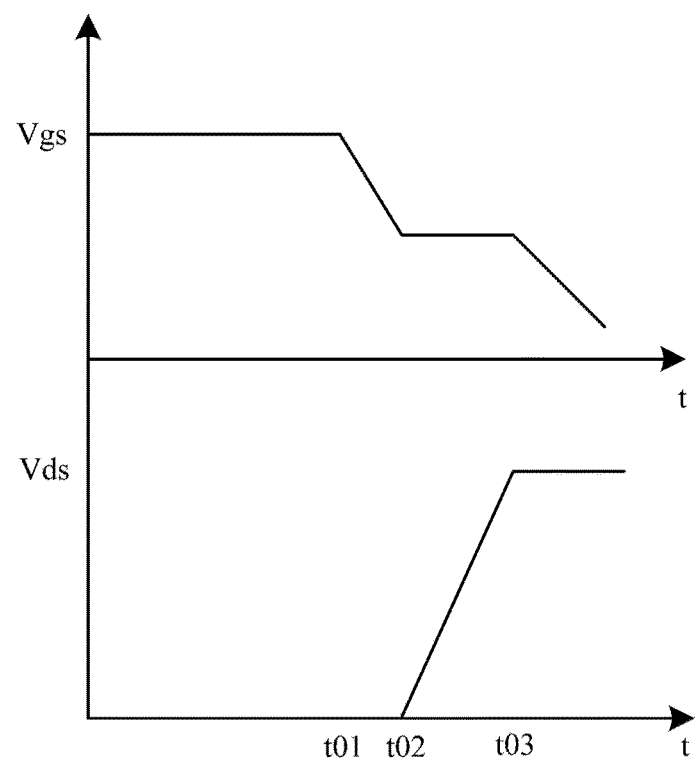
FIG. 1 shows voltage waveforms of a driving pole relative to a source electrode and a drain electrode relative to the source electrode when an N-type power transistor is turned off according to an optional embodiment of the present disclosure.

In one embodiment of the present disclosure, a power transistor driving method is provided. As shown in FIG. 1, voltage waveforms of a driving pole relative to a source electrode Vgs and a drain electrode relative to the source electrode Vds when an N-type power transistor is turned off. When a power transistor is turned off, a drain-source voltage Vds of the power transistor is detected. When the power transistor is an N-type component, and during a time period from t01 to t02, a change rate of the drain-source voltage Vds of the power transistor along with time is less than a first slope threshold, the power transistor is pulled down in a first current. During a time period from t02 to t03, when the change rate of the drain-source voltage Vds of the power transistor along with the time is higher than the first slope threshold, a driving pole of the power transistor is pulled down in a second current. After a time point t03, when the change rate of the drain-source voltage Vds of the power transistor along with the time is less than the first slope threshold again, a pull-down switch of a power transistor driving circuit is turned on or the driving pole of the power transistor is pulled down in a third current.

Figure 2:
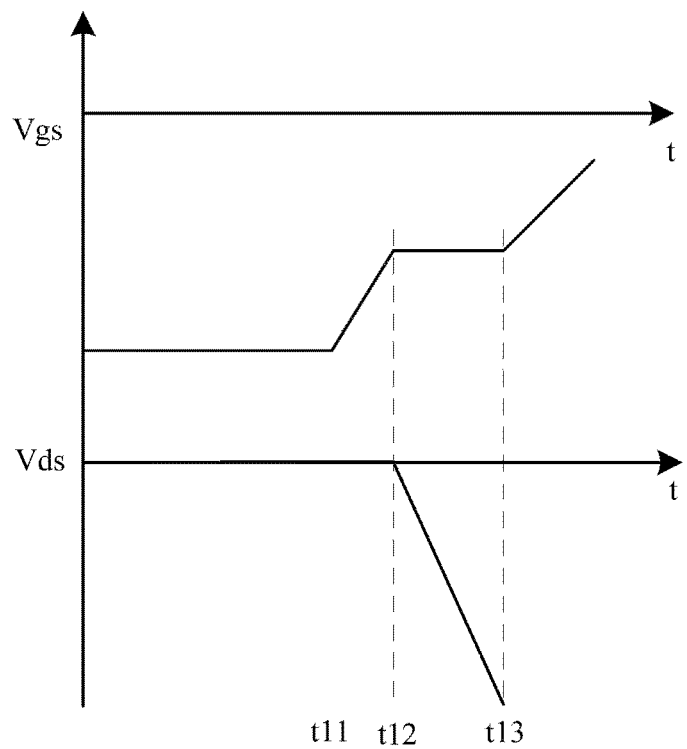
FIG. 2 shows voltage waveforms of a driving pole relative to a source electrode and a drain electrode relative to the source electrode when a P-type power transistor is turned off according to an optional embodiment of the present disclosure.

As shown in FIG. 2, when the power transistor is a P-type component, and during a time period from t11 to t12, a change rate of an absolute value of the drain-source voltage of the power transistor along with the time is less than the first slope threshold, the driving pole of the power transistor is pulled up in the first current. During a time period from t12 to t13, when the change rate of the absolute value of the drain-source voltage of the power transistor along with the time is higher than the first slope threshold, the driving pole of the power transistor is pulled up in the second current. After a time point t13, when the change rate of the absolute value of the drain-source voltage of the power transistor along with the time is less than the first slope threshold again, a pull-up switch of the power transistor driving circuit is turned on or the driving pole of the power transistor is pulled up in the third current.

When the power transistor is the N-type component or the P-type component, the third current is higher than the second current. The first current may be equal to the second current, or may be an arbitrary fixed current value.

Through detecting a slope of the power transistor drain-source voltage, and according to different phases in which the power transistor is located, the power transistor is driven by using different currents, so that turn-off of the power transistor is reliable in process and rapid in speed, and a system is favorable in electromagnetic compatibility.

Another embodiment of the present disclosure is to provide a power transistor driving circuit, as shown in FIG. 1, when a power transistor is turned off, a drain-source voltage Vds of the power transistor is detected by the power transistor driving circuit. And when the power transistor is an N-type component, and during a time period from t01 to t02, a change rate of the drain-source voltage of the power transistor along with time is less than a first slope threshold, the power transistor is pulled down in a first current by the power transistor driving circuit. During a time period from t02 to t03, when the change rate of the drain-source voltage of the power transistor along with the time is higher than the first slope threshold, a driving pole of the power transistor is pulled down in a second current by the power transistor driving circuit. After a time point t03, when the change rate of the drain-source voltage of the power transistor along with the time is less than the first slope threshold again, a pull-down switch of the power transistor driving circuit is turned on or the driving pole of the power transistor is pulled down in a third current.

As shown in FIG. 2, when the power transistor is a P-type component, and during a time period from t11 to t12, a change rate of an absolute value of the drain-source voltage of the power transistor along with the time is less than the first slope threshold, the driving pole of the power transistor is pulled up in the first current by the power transistor driving circuit. During a time period from t12 to t13, when the change rate of the absolute value of the drain-source voltage of the power transistor along with the time is higher than the first slope threshold, the driving pole of the power transistor is pulled up in the second current by the power transistor driving circuit. After a time point t13, when the change rate of the absolute value of the drain-source voltage of the power transistor along with the time is less than the first slope threshold again, a pull-up switch of the power transistor driving circuit is turned on or the driving pole of the power transistor is pulled up in the third current.

When the power transistor is the N-type or the P-type, the third current is higher than the second current. The first current may be equal to the second current, or may be an arbitrary fixed current value.

It is to be noted that in the N-type component, the source electrode is generally connected to a reference ground or connected with the reference ground through a resistance, therefore the drain-source voltage of the power transistor may be represented by detecting the drain-source voltage of the power transistor. In the P-type component, the source electrode is generally connected with a power supply end or connected with the power supply end through the resistance, the drain-source voltage of the power transistor may also be represented by detecting the drain-source voltage of the power transistor.

In an optional embodiment, the power transistor driving circuit includes a slope detection circuit, configured to detect the change rate of the drain-source voltage of the power transistor along with the time. The slope detection circuit is a first capacitance C11.

In an optional embodiment, for the N-type power transistor, the power transistor driving circuit further includes a first pull-down circuit and a second pull-down circuit. The first pull-down circuit is configured to pull down the driving pole of the power transistor in the second current. The second pull-down circuit includes the pull-down switch. During a turn-off period of the power transistor, when the change rate of the drain-source voltage of the power transistor along with the time is firstly higher than the first slope threshold, and then less than the first slope threshold, the pull-down switch of the second pull-down circuit is turned on. In other words, when the power transistor is turned off, and the change rate of the drain-source voltage of the power transistor along with the time is less than the first slope threshold, the driving pole of the power transistor is not pulled down by the second pull-down circuit. When the change rate of the drain-source voltage of the power transistor along with the time is higher than the first slope threshold, the driving pole of the power transistor is still not pulled down by the second pull-down circuit. When the change rate of the drain-source voltage of the power transistor along with the time is less than the first slope threshold, the pull-down switch of the second pull-down circuit is turned on. The first pull-down circuit is a first current source, and a value of the first current source is equal to the second current.

Figure 3:
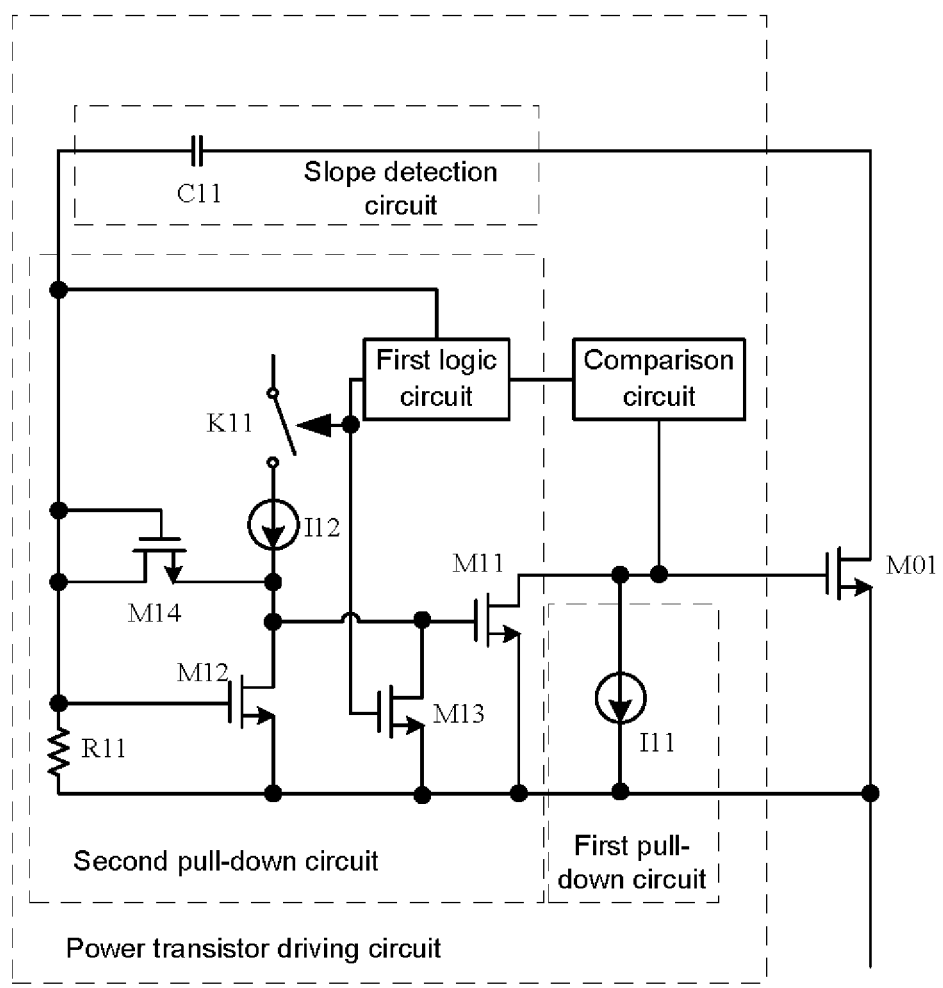
FIG. 3 shows a circuit schematic diagram of a power transistor driving circuit according to an optional embodiment of the present disclosure.

As shown in FIG. 3, in an optional embodiment, the second pull-down circuit includes a first transistor M11, a second transistor M12, a third transistor M13, a second current source I12, a first switch K11 and a first resistance R11. The second current source I12 and the first switch K11 are serially connected to form a first series circuit. A drain electrode of the first transistor M11 is connected with the driving pole of the power transistor. A drain electrode of the second transistor M12 is connected with a driving pole of the first transistor M11. The first, series circuit is connected with the driving pole of the first transistor M11. A driving pole of the second transistor M12 is connected with a reference ground through the first resistance R11. A source electrode of the first transistor M11 and a source electrode of the second transistor M12 are connected with the reference ground. The driving pole of the second transistor M12 receives an output voltage of the slope detection circuit. The third transistor M13 is connected between the driving pole of the first transistor and the reference ground. When the power transistor is turned off, and during the time period from t01 to t02 in FIG. 1, the change rate of the drain-source voltage of the power transistor along with the time is less than the first slope threshold, the first switch K11 is turned off, the third transistor M13 is turned on, the second pull-down switch is not enabled, and the driving pole of the power transistor is not pulled down by the first transistor M11. The driving pole of the power transistor M01 is pulled down in the first current by the first pull-down circuit. During the time period from t02 to t03, when the change rate of the drain-source voltage Vds of the power transistor along with the time is higher than the first slope threshold, the first switch K11 is turned on, the third transistor M13 is turned off, and the second pull-down circuit is enabled. However, since the change rate of the drain-source voltage Vds of the power transistor along with the time is higher than the first slope threshold, the second pull-down circuit is pulled up by the slope detection circuit, the driving pole of the second transistor M12 is pulled up, the second transistor is turned on, and the first transistor M11 is turned off. The driving pole of the power transistor M01 is still not pulled down by the second pull-down circuit, and the driving pole of the power transistor M01 is pulled down in the second current by the first pull-down circuit. In an optional embodiment, the first current is equal to the second current. Then, after the time point t03, when the change rate of the drain-source voltage of the power transistor along with the time is less than the first slope threshold, the second pull-down circuit is continuously enabled. The second pull-down circuit is not pulled up by the slope detection circuit. The driving pole of the second transistor M12 is pulled down by the first resistance R11. The second transistor M12 is turned off. The driving pole of the first transistor M11 is pulled up by the second current source I12. The first transistor M11 is turned on. The driving pole of the power transistor M01 is rapidly pulled down by the first transistor M11. The first transistor M11 is the pull-down switch.

The second pull-down circuit further includes a first logic circuit. The first logic circuit is configured to receive an output voltage of the slope detection circuit, and control turn-on and turn-off of the first switch K11 and the third transistor M13, so as to control enabling of the second pull-down circuit.

In an optional embodiment, the first capacitance C11 is a power transistor (namely a first power transistor) of which a type is the same as a type of the power transistor. A source electrode of the first power transistor is connected with the second pull-down circuit, and a drain electrode of the first power transistor is connected with the drain electrode of the power transistor. A driving pole of the first power transistor and a source electrode of the first power transistor are short-circuited or the source electrode of the first power transistor is connected with the reference ground.

As shown in FIG. 3, the power transistor driving circuit further includes a comparison circuit. The comparison circuit receives a driving pole voltage of the power transistor M01. The first logic circuit receives an output voltage of a comparator. The comparison circuit compares the driving pole voltage of the power transistor M01 with the first voltage threshold, when the driving pole voltage of the power transistor is less than the first voltage threshold, output of the comparison circuit is inverted, the first logic circuit controls the third transistor to be turned off, controls the first switch K11 to be turned on, and controls the first transistor M11 to be turned on.

Figure 4:
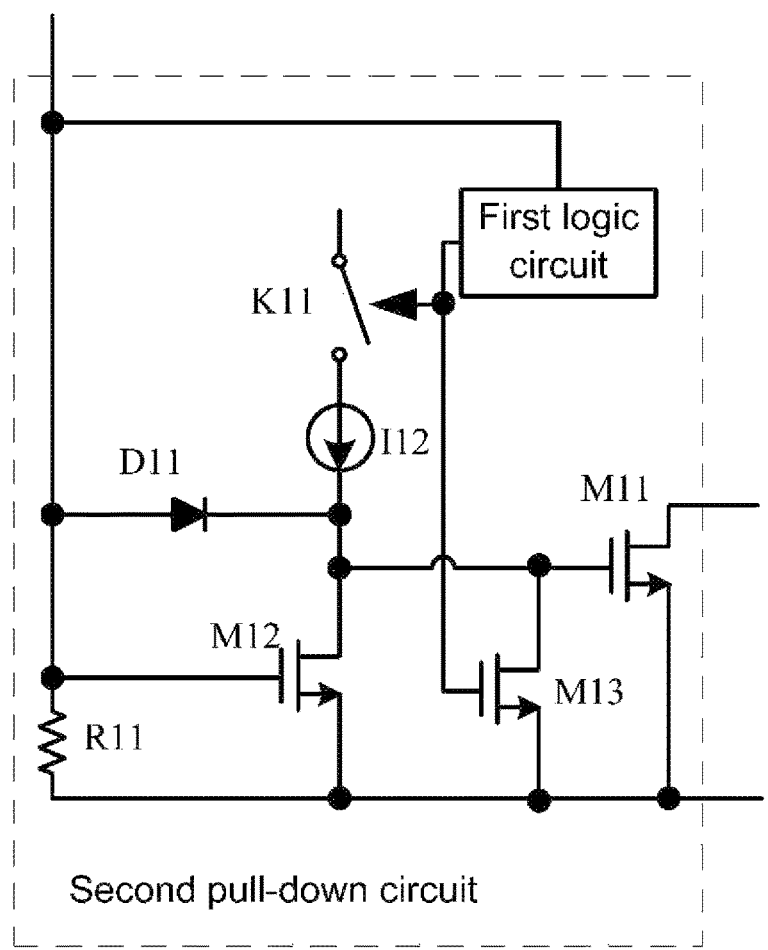
FIG. 4 shows a circuit schematic diagram of a second pull-down circuit according to an optional embodiment of the present disclosure.

As shown in FIG. 3, the second pull-down circuit further includes a first turn-on element, the first turn-on element may be a transistor M14. A gate electrode of the transistor M14 is connected with a drain electrode of the transistor M14. A source electrode of the transistor M14 is connected with a drain electrode of the second transistor M12. And the drain electrode of the transistor M14 is connected with a gate electrode of the second transistor M12. The transistor M14 is connected in the form of a diode. During the time period from t02 to t03, the transistor M14 is served as the diode, and configured to pull the driving pole of the first transistor M11 near a turn-on threshold voltage. Therefore, at the time point t03, the first transistor M11 may be more rapidly turned on. As shown in FIG. 4, the first turn-on element may also be connected between the drain electrode and the gate electrode of the second transistor M12 by using a diode D11.

Figure 5A:
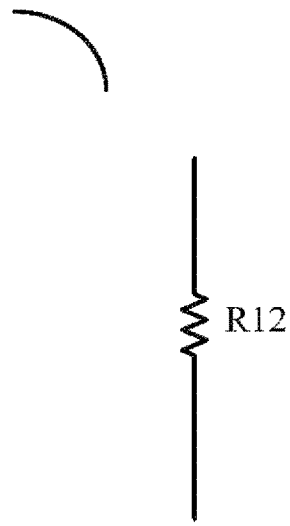
FIG. 5(a) shows a circuit schematic diagram of a first pull-down circuit according to an optional embodiment of the present disclosure.
Figure 5B:
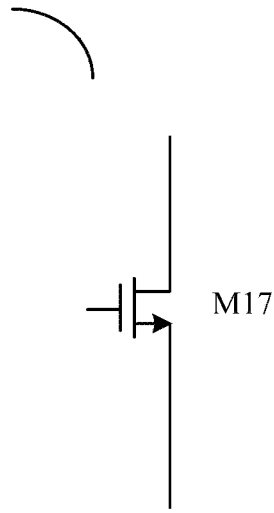
FIG. 5(b) shows a circuit schematic diagram of a first pull-down circuit according to an optional embodiment of the present disclosure.

In an optional embodiment, the first pull-down circuit is a second resistance or a seventh transistor. As shown in FIG. 5(a) and FIG. 5(b), the first pull-down circuit is a second resistance R12 or a seventh transistor M17.

Figure 6:
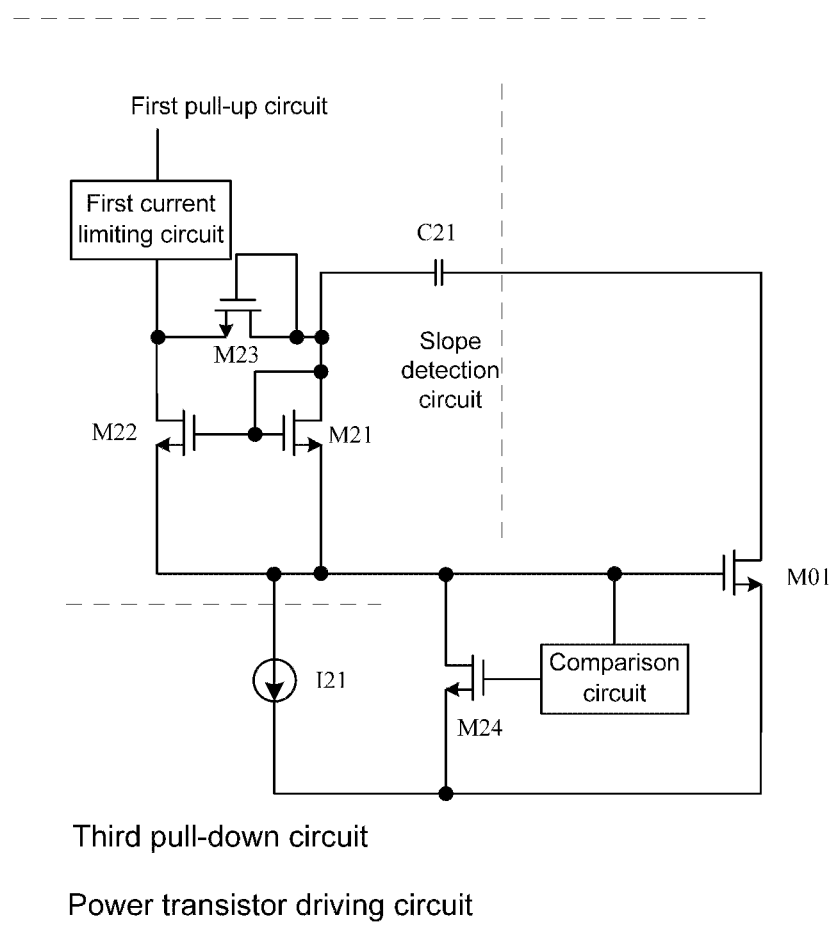
FIG. 6 shows a circuit schematic diagram of a power transistor driving circuit according to an optional embodiment of the present disclosure.

As shown in FIG. 6, in an optional embodiment, the power transistor driving circuit further includes a third pull-down circuit and a first pull-up circuit. The driving pole of the power transistor is pulled down in the first current by the third pull-down circuit. Output of the slope detection circuit is received by the first pull-up circuit. When the change rate of the drain-source voltage of the power transistor M01 along with the time is less than the first slope threshold, the driving pole of the power transistor is not pulled up. When the change rate of the drain-source voltage of the power transistor M01 along with the time is higher than the first slope threshold, the driving pole of the power transistor is pulled up.

As shown in FIG. 6, the slope detection circuit is a second capacitance C21. The third pull-down circuit is a fourth current source I21. The first current is equal to the third current, and a value of the fourth current source I21 is equal to the third current.

As shown in FIG. 6, the first pull-up circuit includes a fourth transistor M21 and a fifth transistor M22. The fourth transistor M21 and the fifth transistor M22 form an image current mirror. A source electrode of the fourth transistor M21 and a source electrode of the fifth transistor M22 are connected with the driving pole of the power transistor M01. A drain electrode of the fourth transistor M21 is connected with a driving pole of the fourth transistor M21, and the fourth transistor M21 is configured to receive the output voltage of the slope detection circuit. When the power transistor M01 is turned off, during the time period from t01 to t02 in FIG. 1, the drain electrode of the fourth transistor M21 is not pulled up by the slope detection circuit, no current flows through the fourth transistor M21 and the fifth transistor M22, the driving pole of the power transistor is not pulled up by the first pull-up circuit, and the driving pole of the power transistor is pulled down in the first current by the third pull-down circuit. During the time period from t02 to t03 in FIG. 1, when the change rate of the drain-source voltage of the power transistor M01 along with the time is higher than the first slope threshold, the drain electrode of the fourth transistor M21 is pulled up by the slope detection circuit, the driving pole of the power transistor M01 is pulled up by the first pull-up circuit, the driving pole of the power transistor M01 is pulled down by the third pull-down circuit, and a difference between a pull-down current of the third pull-down circuit and a pull-up current of the first pull-up circuit is the second current. After the time period from the time point t03 in FIG. 1, since the change rate of the drain-source voltage of the power transistor M01 along with the time is less than the first slope threshold, the drain electrode of the fourth transistor M21 is not pulled up by the slope detection circuit, no current flows through the fourth transistor M21 and the fifth transistor M22, the driving pole of the power transistor is not pulled up by the first pull-up circuit, and the driving pole of the power transistor is pulled down in the third current by the third pull-down circuit. The third current is equal to the first current.

As shown in FIG. 6, after the time period from the time point t03, in order to accelerate a turn-off speed when a power transistor driving pole voltage is less than the first voltage threshold, the power transistor driving circuit further includes a sixth transistor M24, the driving pole of the power transistor is connected with the reference ground through the sixth transistor M24. When the power transistor driving pole voltage is less than the first voltage threshold, the sixth transistor M24 is turned on. The power transistor driving circuit further includes a comparison circuit. The comparison circuit receives a driving pole voltage of the power transistor M01, and the comparison circuit compares the driving pole voltage of the power transistor M01 with the first voltage threshold. When the driving pole voltage is less than the first voltage threshold, the sixth transistor is controlled to be turned on according to output of the comparison circuit, thereby a power transistor M01 driving pole pull-down speed is greatly accelerated.

As shown in FIG. 6, the first pull-up circuit further includes a second turn-on element and a first current limiting circuit. The first current limiting circuit is connected with a drain electrode of the fifth transistor M22. The second turn-on element may be a transistor M23. A gate electrode of the transistor M23 is connected with a source electrode of the transistor M23. The source electrode of the transistor M23 is connected with the drain electrode of the transistor M22. The drain electrode of the transistor M23 is connected with the drain electrode of the transistor M21. The transistor M23 is connected in the form of a diode, so that a gate end of the current mirror may not be raised too high, thereby when an output current of the slope detection circuit is gone, the pull-up current may be more rapidly turned off. The second turn-on element may also be a diode, and connected between the drain electrode of the transistor M22 and the drain electrode of the transistor M21. The first current limiting circuit may be one of a current source, a resistance and a transistor.

Figure 7:
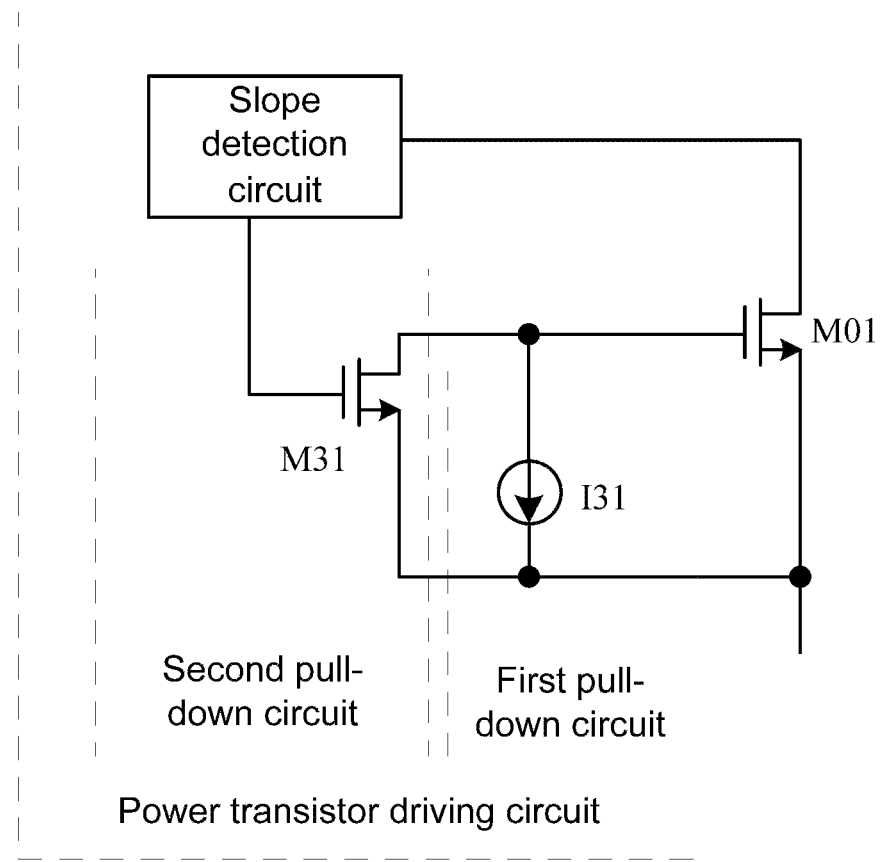
FIG. 7 shows a circuit schematic diagram of a power transistor driving circuit according to another optional embodiment of the present disclosure.

As shown in FIG. 7, it is an embodiment of another power transistor driving circuit. The power transistor driving circuit includes a first pull-down circuit, a second pull-down circuit and a slope detection circuit. The slope detection circuit receives a drain electrode voltage of the power transistor M01. The first pull-down circuit receives an output voltage of the slope detection circuit. Both of the first pull-down circuit and the second pull-down circuit are connected with the driving pole and the source electrode of the power transistor M01. The first pull-down circuit includes a current source I31. The second pull-down circuit includes a transistor M31. Output of the slope detection circuit is connected with a gate electrode of the transistor M31. A source electrode of the M31 is connected with the source electrode of the power transistor M01. A drain electrode of the M31 is connected with the driving pole of the power transistor M01.

When the power transistor M01 is turned off, during the time period from t01 to t02 in FIG. 1, the output of the slope detection circuit is low level, the transistor M31 is turned off. The driving pole of the power transistor is pulled down by the first pull-down circuit, and the driving pole of the power transistor M01 is not pulled down by the second pull-down circuit. During the time period from t02 to t03 in FIG. 1, when the change rate of the drain-source voltage of the power transistor M01 along with the time is higher than the first slope threshold, the output of the slope detection circuit is low level, the driving pole of the power transistor M01 is not pulled down by the second pull-down circuit, the driving pole of the power transistor is pulled down by the first pull-down circuit, and a value of the pull-down current is equal to the second current. After the time period from the time point t03 in FIG. 1, since the change rate of the drain-source voltage of the power transistor M01 along with the time is less than the first slope threshold, the output of the slope detection circuit is high level, the driving pole of the power transistor is pulled down by both of the second pull-down circuit and the first pull-down circuit. It is to be noted that, during the time period from t01 to t02 in FIG. 1, and after the time period from the time point t03, the change rate of the drain-source voltage of the power transistor M01 along with the time is less than the first slope threshold. However during the time period from t01 to t02, the output of the slope detection circuit is low level, and after the time period from the time point t03, the output of the slope detection circuit is high level. In other words, the output of the slope detection circuit is not only adjusted according to the drain-source voltage of the power transistor M01, but also according to a time sequence. For example, the slope detection circuit outputs high level when the change rate of the drain-source voltage of the power transistor M01 along with the time is firstly higher than the first slope threshold, and then less than the first slope threshold.

Another embodiment of the present disclosure is to provide a switching circuit, including a driving circuit of the above power transistor.

Although the embodiments are described and illustrated separately above, some common technologies are related. Replacements and integrations may be made among the embodiments by those of ordinary skill in the art, and the related content that is not clearly recorded in one embodiment may refer to another embodiment with the record.

The above implementation modes do not constitute limitation on the scope of protection of the technical scheme. Any modifications, equivalent replacements and improvements and the like made within the spirit and principle of the above implementation modes should be included in the scope of protection of the technical scheme.

What is claimed is:

1. A power transistor driving method, wherein when a power transistor is turned off, a drain-source voltage of the power transistor is detected, and when the power transistor is an N-type component, and a change rate of the drain-source voltage of the power transistor along with time is lower than a first slope threshold, the power transistor is pulled down in a first current; when the change rate of the drain-source voltage of the power transistor along with the time is higher than the first slope threshold, a driving pole of the power transistor is pulled down in a second current; and when the change rate of the drain-source voltage of the power transistor along with the time is lower than the first slope threshold again, a pull-down switch of a power transistor driving circuit is turned on or the driving pole of the power transistor is pulled down in a third current;

when the power transistor is a P-type component, and a change rate of an absolute value of the drain-source voltage of the power transistor along with the time is lower than the first slope threshold, the driving pole of the power transistor is pulled up in the first current; when the change rate of the absolute value of the drain-source voltage of the power transistor along with the time is higher than the first slope threshold, the driving pole of the power transistor is pulled up in the second current; and when the change rate of the absolute value of the drain-source voltage of the power transistor along with the time is lower than the first slope threshold again, a pull-up switch of the power transistor driving circuit is turned on or the driving pole of the power transistor is pulled up in the third current; and the third current is higher than the second current;

wherein the driving pole of the power transistor is connected with a reference ground through a sixth transistor, when a driving pole voltage of the power transistor is lower than a first voltage threshold, the sixth transistor is turned on.

2. The power transistor driving method as claimed in claim 1, wherein the first current is equal to the second current.

3. The power transistor driving method as claimed in claim 1, wherein the first current is a fixed current value.

4. A power transistor driving circuit, wherein when a power transistor is turned off, a drain-source voltage of the power transistor is detected by the power transistor driving circuit, and when the power transistor is an N-type component, and a change rate of the drain-source voltage of the power transistor along with time is lower than a first slope threshold, the power transistor is pulled down in a first current by the power transistor driving circuit; when the change rate of the drain-source voltage of the power transistor along with the time is higher than the first slope threshold, a driving pole of the power transistor is pulled down in a second current by the power transistor driving circuit; and when the change rate of the drain-source voltage of the power transistor along with the time is lower than the first slope threshold again, a pull-down switch of the power transistor driving circuit is turned on or the driving pole of the power transistor is pulled down in a third current by the power transistor driving circuit;

when the power transistor is a P-type component, and a change rate of an absolute value of the drain-source voltage of the power transistor along with the time is lower than the first slope threshold, the driving pole of the power transistor is pulled up in the first current by the power transistor driving circuit; when the change rate of the absolute value of the drain-source voltage of the power transistor along with the time is higher than the first slope threshold, the driving pole of the power transistor is pulled up in the second current by the power transistor driving circuit; and when the change rate of the absolute value of the drain-source voltage of the power transistor along with the time is lower than the first slope threshold again, a pull-up switch of the power transistor driving circuit is turned on or the driving pole of the power transistor is pulled up in the third current by the power transistor driving circuit; and the third current is higher than the second current;

wherein the power transistor driving circuit comprises a sixth transistor, the driving pole of the power transistor is connected with the reference ground through the sixth transistor, when a driving pole voltage of the power transistor is lower than a first voltage threshold, the sixth transistor is turned on.

5. The power transistor driving circuit as claimed in claim 4, wherein the first current is equal to the second current.

6. The power transistor driving circuit as claimed in claim 4, wherein the first current is a fixed current value.

7. The power transistor driving circuit as claimed in claim 4, further comprising a slope detection circuit, configured to detect the change rate of the drain-source voltage of the power transistor along with the time.

8. The power transistor driving circuit as claimed in claim 4, further comprising a first pull-down circuit and a second pull-down circuit, wherein the first pull-down circuit is configured to pull down the driving pole of the power transistor in the second current; the second pull-down circuit comprises the pull-down switch; and during a turn-off period of the power transistor, when the change rate of the drain-source voltage of the power transistor along with the time is firstly higher than the first slope threshold, and then lower than the first slope threshold, the pull-down switch of the second pull-down circuit is turned on.

9. The power transistor driving circuit as claimed in claim 8, wherein the second pull-down circuit comprises a first transistor, a second transistor, a third transistor, a second current source, a first switch and a first resistance, the second current source and the first switch are serially connected to form a first series circuit, a drain electrode of the first transistor is connected with the driving pole of the power transistor, a drain electrode of the second transistor is connected with a driving pole of the first transistor, the first series circuit is connected with the driving pole of the first transistor, a driving pole of the second transistor is connected with a reference ground through the first resistance, a source electrode of the first transistor and a source electrode of the second transistor are connected with the reference ground, the driving pole of the second transistor receives an output voltage of the slope detection circuit, the third transistor is connected between the driving pole of the first transistor and the reference ground, when the power transistor is turned off, and the change rate of the drain-source voltage of the power transistor along with the time is lower than the first slope threshold, the first switch is turned off, the third transistor is turned on, the second pull-down switch is not enabled, and the driving pole of the power transistor is not pulled down by the first transistor; when the change rate of the drain-source voltage of the power transistor along with the time is higher than the first slope threshold, the first switch is turned on, the third transistor is turned off, and the second pull-down circuit is enabled; when the change rate of the drain-source voltage of the power transistor along with the time is lower than the first slope threshold again, the second pull-down circuit is continuously enabled; and the first transistor is the pull-down switch.

10. The power transistor driving circuit as claimed in claim 9, wherein the second pull-down circuit further comprises a first turn-on element, the first turn-on element is connected between a driving pole and a drain electrode of the second transistor, the first turn-on element is a transistor and a drain electrode of the transistor is connected with a driving pole of the transistor, or the first turn-on element is a diode.

11. The power transistor driving circuit as claimed in claim 9, wherein the second pull-down circuit further comprises a first logic circuit, the first logic circuit is configured to receive an output voltage of the slope detection circuit, and control turn-on and turn-off of the first switch and the third transistor.

12. The power transistor driving circuit as claimed in claim 8, further comprising a third pull-down circuit and a first pull-up circuit, wherein the third pull-down circuit is configured to pull down the driving pole of the power transistor in the first current;
the first pull-up circuit is configured to receive the output voltage of the slope detection circuit, when the change rate of the drain-source voltage of the power transistor along with the time is lower than the first slope threshold, the driving pole of the power transistor is not pulled up; and when the change rate of the drain-source voltage of the power transistor along with the time is higher than the first slope threshold, the driving pole of the power transistor is pulled up.

13. The power transistor driving circuit as claimed in claim 12, wherein the first pull-up circuit comprises a fourth transistor and a fifth transistor, a source electrode of the fourth transistor and a source electrode of the fifth transistor are connected with the driving pole of the power transistor, a drain electrode of the fourth transistor is connected with a driving pole of the fourth transistor, and configured to receive the output voltage of the slope detection circuit.

14. The power transistor driving circuit as claimed in claim 13, wherein the first pull-up circuit further comprises a second turn-on element and a first current limiting circuit, the first current limiting circuit is connected with a drain electrode of the fifth transistor, the second turn-on element is connected between the source electrode of the fourth transistor and the drain electrode of the fifth transistor, the second turn-on element is a transistor and a drain electrode of the transistor is connected with a driving pole of the transistor, or the second turn-on element is a diode.

15. The power transistor driving circuit as claimed in claim 12, wherein the slope detection circuit is a first capacitance, the third pull-down circuit is a fourth current source, the first current is equal to the third current, and a value of the fourth current source is equal to the third current.

16. The power transistor driving circuit as claimed in claim 8, wherein the slope detection circuit is a first capacitance, the first pull-down circuit is a first current source or a second resistance or a seventh transistor, and a value of the first current source is equal to the second current.

17. The power transistor driving circuit as claimed in claim 16, wherein the first capacitance is a first power transistor of which has a type is the same as a type of the power transistor, a source electrode of the first power transistor is connected with the second pull-down circuit, and drain electrode of the first power transistor is connected with a drain electrode of the power transistor.

18. The power transistor driving circuit as claimed in claim 9, wherein when the driving pole voltage of the power transistor is lower than the first voltage threshold, the first transistor is turned on.

19. A switching circuit, comprising: a power component driving circuit, wherein when a power transistor is turned off, a drain-source voltage of the power transistor is detected by the power transistor driving circuit, and when the power transistor is an N-type component, and a change rate of the drain-source voltage of the power transistor along with time is lower than a first slope threshold, the power transistor is pulled down in a first current by the power transistor driving circuit; when the change rate of the drain-source voltage of the power transistor along with the time is higher than the first slope threshold, a driving pole of the power transistor is pulled down in a second current by the power transistor driving circuit; and when the change rate of the drain-source voltage of the power transistor along with the time is lower than the first slope threshold again, a pull-down switch of the power transistor driving circuit is turned on or the driving pole of the power transistor is pulled down in a third current by the power transistor driving circuit;
when the power transistor is a P-type component, and a change rate of an absolute value of the drain-source voltage of the power transistor along with the time is lower than the first slope threshold, the driving pole of the power transistor is pulled up in the first current by the power transistor driving circuit; when the change rate of the absolute value of the drain-source voltage of the power transistor along with the time is higher than the first slope threshold, the driving pole of the power transistor is pulled up in the second current by the power transistor driving circuit; and when the change rate of the absolute value of the drain-source voltage of the power transistor along with the time is lower than the first slope threshold again, a pull-up switch of the power transistor driving circuit is turned on or the driving pole of the power transistor is pulled up in the third current by the power transistor driving circuit; and the third current is higher than the second current;
wherein the power transistor driving circuit comprises a sixth transistor, the driving pole of the power transistor is connected with the reference ground through the sixth transistor, when a driving pole voltage of the power transistor is lower than a first voltage threshold, the sixth transistor is turned on.

\* \* \* \* \*